US010177556B2

(12) United States Patent
Bakhali et al.

(10) Patent No.: US 10,177,556 B2
(45) Date of Patent: Jan. 8, 2019

(54) POWER SUPPLY CLAMP

(71) Applicant: ARM Limited, Cambridge (GB)

(72) Inventors: Abdellah Bakhali, Grenoble (FR); Mikael Rien, Grenoble (FR); Fabrice Blanc, Grenoble (FR)

(73) Assignee: ARM Limited, Cambridge (GB)

( * ) Notice: Subject to any disclaimer, the term of this patent is extended or adjusted under 35 U.S.C. 154(b) by 217 days.

(21) Appl. No.: 15/130,920

(22) Filed: Apr. 15, 2016

(65) Prior Publication Data

US 2016/0322806 A1 Nov. 3, 2016

(30) Foreign Application Priority Data

Apr. 30, 2015 (GB) .................................. 1507446.1

(51) Int. Cl.
*H02H 3/20* (2006.01)
*G01R 29/08* (2006.01)
*G01R 31/40* (2014.01)
*H02H 9/04* (2006.01)

(52) U.S. Cl.
CPC .......... *H02H 3/20* (2013.01); *G01R 29/0814* (2013.01); *G01R 31/40* (2013.01); *H02H 9/041* (2013.01); *H02H 9/046* (2013.01)

(58) Field of Classification Search
CPC .......... H02H 3/20; H02H 9/041; H02H 9/046; G01R 29/0814; G01R 31/40
USPC ........................................................... 361/18
See application file for complete search history.

(56) References Cited

U.S. PATENT DOCUMENTS

| 7,518,846 B1 | 4/2009 | Meyer | |
| 8,498,085 B2 * | 7/2013 | Altolaguirre | H02H 9/046 361/118 |
| 2010/0321841 A1 * | 12/2010 | Worley | H02H 9/046 361/56 |
| 2014/0211349 A1 | 7/2014 | Braun et al. | |

OTHER PUBLICATIONS

UKIPO Search Report; GB 1507446.1; dated Nov. 25, 2015.

* cited by examiner

*Primary Examiner* — Kevin J Comber
(74) *Attorney, Agent, or Firm* — Pramudji Law Group PLLC; Ari Pramudji

(57) ABSTRACT

A power supply clamp connectable between power rails of an electronic circuit comprises a switching component which is switchable to provide a connection path between the power rails of the electronic circuit; a first detector configured to detect an electrostatic discharge event having a first characteristic time period and to generate a detector output signal in response to the detection; a series of one or more successive intermediate amplification stages between the first detector and the switching component, the series of amplification stages providing a control signal path for a control signal to control switching of the switching component in response to the detector output signal; and a second detector configured to detect an electrostatic discharge event having a second characteristic time period, shorter than the first characteristic time period, the second detector being provided at a node in the control signal path subsequent to the first detector (for example, at a second or subsequent one of the series of intermediate amplification stages) so that a detection by the second detector causes the control signal to control switching of the switching component.

15 Claims, 4 Drawing Sheets

POWER SUPPLY CLAMP

CROSS-REFERENCE TO RELATED APPLICATIONS

This application claims priority to United Kingdom Patent Application No. GB 1507446.1, filed 2015 Apr. 30, titled POWER SUPPLY CLAMP, and the entire disclosure of which is herein incorporated by reference.

BACKGROUND

This disclosure relates to power supply clamps.

Power supply clamps are used to provide a switchable low impedance path between power rails of an electronic circuit, for example to provide at least some protection against damage due to electrostatic discharge (ESD) events.

There are many potential causes of ESD events. Two such potential causes which have rather different temporal characteristics are electrostatic discharges from a charged external item (such as the human body, or an external device or machine) touching the electronic circuit, and electrostatic discharges resulting from a charge retained by the electronic circuit itself being discharged to ground, for example by one or more terminals or pins of the circuit touching an earthed surface. Typically, ESD events relating to charged humans or external machines have a slower rise time and a slower decay (which is to say, they last longer) than ESD events relating to charged devices being discharged to ground.

Each individual ESD event has parameters (magnitude, temporal characteristics and the like) which depend on its particular circumstances. But as part of the design of protection arrangements intended to alleviate the effects of an ESD, various models of typical (or, at least, reproducible) ESD events may be used. Two such models are the Human Body Model (HBM), which models a slow rise time, slow decay ESD event, and the Charged Device Model (CDM), which models a fast rise time, fast decay ESD event. ESD protection arrangements are often designed so as to protect against one or both of these modelled ESD events, and test procedures are available according to the models which can be applied to an electronic circuit under test to find out whether it can withstand the modelled ESD event.

ESD protection is relevant to many types of electronic circuit, but has particular relevance to semiconductor devices such as those implemented as integrated circuits. One reason is that the small physical size of any individual component within the integrated circuit can limit the instantaneous power which that component can safely dissipate or the voltage stress which the component can safely sustain (during an ESD event) without damage.

An example ESD event can occur in the form of a discharge across the power rails of an electronic circuit. As mentioned above, a power supply clamp can provide a switchable low impedance path between the power rails so that the low impedance path can be enabled when an ESD event is detected. The low impedance path can handle a high instantaneous current. In some examples, a large field effect transistor is used. Therefore, an example power supply clamping process involves detecting the ESD event promptly, switching the low impedance path so that a current impulse caused by the ESD event is passed by the low impedance path, maintaining the low impedance path for the duration of the ESD event, and then switching off the low impedance path so as to return to normal operation of the electronic circuit.

SUMMARY

In an example arrangement there is provided a power supply clamp connectable between power rails of an electronic circuit, the power supply clamp comprising a switching component which is switchable to provide a connection path between the power rails of the electronic circuit; a first detector configured to detect an electrostatic discharge event having a first characteristic time period and to generate a detector output signal in response to the detection; a series of one or more successive intermediate amplification stages between the first detector and the switching component, the series of amplification stages providing a control signal path for a control signal to control switching of the switching component in response to the detector output signal; and a second detector configured to detect an electrostatic discharge event having a second characteristic time period, shorter than the first characteristic time period, the second detector being provided at a node in the control signal path subsequent to the first detector so that a detection by the second detector causes the control signal to control switching of the switching component.

In an example arrangement there is provided a power supply clamp connectable between power rails of an electronic circuit, the power supply clamp comprising switching means which is switchable to provide a connection path between the power and ground rails of the electronic circuit; first detecting means for detecting an electrostatic discharge event having a first characteristic time period and generating a detector output signal in response to the detection; a series of one or more successive intermediate amplifying means between the first detecting means and the switching means, providing a control signal path for a control signal to control switching of the switching component in response to the detector output signal; and second detecting means for detecting an electrostatic discharge event having a second characteristic time period, shorter than the first characteristic time period, the second detecting means being provided at a node in the control signal path subsequent to the first detecting means so that a detection by the second detecting means causes the control signal to control switching of the switching means.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
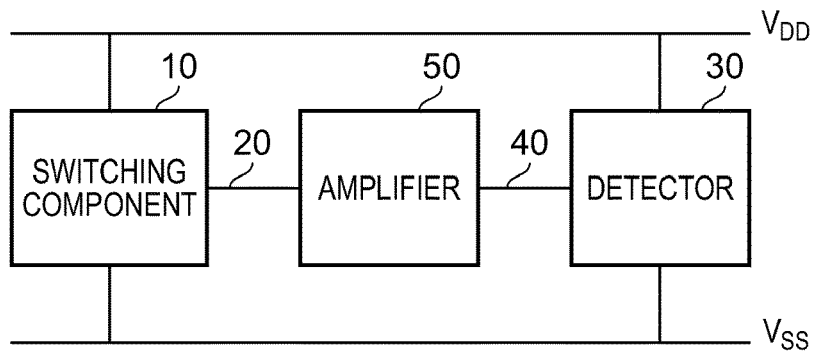
FIG. 1 schematically illustrates a power supply clamp.

Before discussing the embodiments with reference to the accompanying figures, the following description of embodiments is provided.

An example embodiment provides a power supply clamp connectable between power rails of an electronic circuit, the power supply clamp comprising:

a switching component which is switchable to provide a connection path (such as a low impedance connection path) between the power rails of the electronic circuit;

a first detector configured to detect an electrostatic discharge event having a first characteristic time period and to generate a detector output signal in response to the detection;

a series of one or more successive intermediate amplification stages between the first detector and the switching component, the series of amplification stages providing a control signal path for a control signal to control switching of the switching component in response to the detector output signal; and a second detector configured to detect an electrostatic discharge event having a second characteristic time period, shorter than the first characteristic time period, the second detector being provided at a node in the control signal path subsequent to the first detector (for example, at a second or subsequent one of the series of intermediate amplification stages in the case that two or more stages are provided) so that a detection by the second detector causes the control signal to control switching of the switching component.

The present techniques provide for different detection of fast ESD events such as CDM events and slower ESD events such as HBM events. The fast detection is provided at a later position in a chain of intermediate amplification stages than the slower detection, meaning that the faster detection is less delayed by the intermediate amplification stages. This provides for a potentially faster reaction to fast events such as CDM events.

Further advantages of example embodiments can include: the provision of a specific and independent triggering path to address the fast time scale of CDM events and a separate and longer timescale triggering path to address the slower timescale of HBM events.

Transistors such as MOSFETs may be used in place of high value resistors, which can provide area reduction in an integrated circuit context.

In some examples, the first detector is a human body model electrostatic discharge event detector, for example being configured to detect an electrostatic discharge event having a voltage rise time of between 2 and 10 nanoseconds and, for example, being configured to maintain the detector output signal for at least 600 nanoseconds.

Although other techniques may be used, in example embodiments the first detector comprises a capacitance and a resistance connected in series between the power rails of the electronic circuit.

The size of the capacitance (and therefore its area on an integrated circuit device) may be reduced by providing a current mirror connected to the capacitance of the first detector.

In example embodiments the second detector is a charged device model electrostatic discharge event detector, for example being configured to detect an electrostatic discharge event having a voltage rise time of less than 1 nanosecond and for example being configured to maintain the detector output signal for no more than 10 nanoseconds.

In example embodiments the series of successive intermediate amplification stages comprises a series of successive inverter circuits each comprising a transistor pair, series-connected between the power rails. For example, the second detector may comprise a capacitance and a resistance (as true resistor or MOS used as resistor) connected in series between the power rails of the electronic circuit and with output signal going to a node in the control signal path between two successive stages of the series of intermediate amplifier stages.

In example embodiments the switching component comprises a transistor switchable to provide a connection path having an impedance of less than 1 ohm between the power rails.

Another example embodiment provides a power supply clamp connectable between power rails of an electronic circuit, the power supply clamp comprising:

switching means which is switchable to provide a connection path between the power and ground rails of the electronic circuit;

first detecting means for detecting an electrostatic discharge event having a first characteristic time period and generating a detector output signal in response to the detection;

a series of one or more successive intermediate amplifying means between the first detecting means and the switching means, the series providing a control signal path for a control signal to control switching of the switching component in response to the detector output signal; and second detecting means for detecting an electrostatic discharge event having a second characteristic time period, shorter than the first characteristic time period, the second detecting means being provided at a node in the control signal path subsequent to the first detector so that a detection by the second detecting means causes the control signal to control switching of the switching means.

The techniques described here are particularly useful in the context of an electronic circuit comprising a power supply clamp according to any one of the preceding claims, optionally connected to a power supply FIG. 1 schematically illustrates a power supply clamp connectable between power rails of an electronic circuit (not shown). The power supply clamp comprises a switching component 10 which is selectively operable under the control of a control signal 20 to provide a low impedance path (for example, a path having an impedance of less than 1Ω) between the power rails, so that if an electrostatic discharge (ESD) event is detected, a higher than normal current flow resulting from the event is routed via the switching component 10 rather than via any other components connected between the power rails of the electronic circuit. Generally speaking, the switching component 10 may be selected so as to (a) switch sufficiently quickly that its switching operation can be relevant during an ESD event, and (b) handle the temporary but unusually large current flows associated with an ESD event.

ESD events are detected in FIG. 1 by a detector 30 which supplies a detection signal 40 to an amplifier 50, which in turn amplifies the detection signal to form the control signal 20. All of these components will be discussed further below.

The amplifier 50, which may (as discussed below) be formed as a succession of amplification stages, provides a control signal path between the detector 30 and the switching component 10. For example, the amplifier 50 can amplify a detection signal form the detector 30 to provide a control signal to the switching component. It provides various nodes as part of the path, being at least an input node and an output node, and in some embodiments providing one or more intermediate nodes along the path, for example nodes between successive amplification stages in a multi-amplifier arrangement. So, although in FIG. 1 and FIG. 10 (discussed below) the control signal 20 is indicated at the input to the switching component, it follows a control signal path of the series of one or more intermediate amplification stages to arrive at that point in the circuitry.

The power rails in FIG. 1 are shown, for the purposes of this example only, as a positive power rail ($V_{DD}$) and an earthed power rail ($V_{SS}$). However, other arrangements could be used, such as a positive power rail and a negative rail.

To illustrate some of the principles involved in this type of arrangement, generic examples will now be discussed, before moving onto a detailed discussion of embodiments of the present disclosure.

Figure 2:
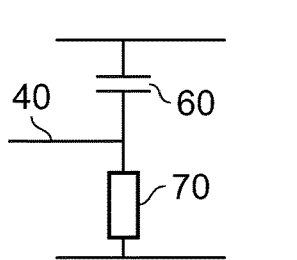
FIG. 2 schematically illustrates an ESD detector.

FIG. 2 schematically illustrates an ESD detector usable as the detector 30 in FIG. 1, for example. The detector comprises a capacitance 60 in series with a resistance 70. The detection signal 40 is derived from the junction of the capacitance 60 and the resistance 70. Other types of detectors may be used, for example using a current mirror (as discussed with reference to FIG. 10) and various resistances and/or capacitances. Note that FIG. 2 shows a C-R stage, but an R-C stage could be used instead.

Figure 3:
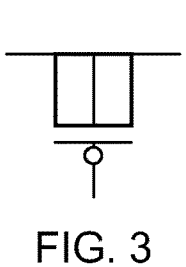
FIG. 3 schematically illustrates an example implementation of a capacitance.

FIG. 3 schematically illustrates an example implementation of a capacitor in a manner which is particularly suited for use in an integrated circuit environment. In FIG. 3, a metal oxide silicone field effect transistor (MOSFET), which is shown as PMOS, but could be either NMOS or PMOS, is fabricated with the drain, source and substrate terminals connected to one another so that collectively they provide one terminal of the capacitance, with the gate of the MOSFET providing the other terminal. Similarly, a resistance can be implemented by a MOSFET device with the gate permanently connected so as to place the device in an "on" state.

Figure 4:
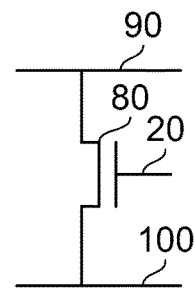
FIG. 4 schematically illustrates an example switching component.

FIG. 4 schematically illustrates an example switching component 10. A physically large (at least, in comparison to other circuit components) NMOSFET or PMOSFET 80 is used. This is sometimes referred to as a "BigFET" as a colloquial indication of its desired property of handling transient but potentially large currents during an ESD event. The BigFET 80 provides a suitable low impedance path between the power rails 90, 100 when switched on by the control signal 20.

Typical parameters for ESD events which need to be handled by the BigFET 80 are a peak voltage of a few kV such as two or three kV, inducing a peak discharging current of potentially more than 1A, for example 6A or more in a CDM ESD event. However, the duration of an ESD event is typically of the order of less than 1 µs. ESD damage is considered to be caused primarily by the heavy instantaneous currents associated with the events or the voltage build-up while the heavy ESD current is flowing through the circuit, but the detection of an ESD event is often carried out by detecting a rapid rate of change of voltage. From the point of view of an ESD detector, a rate of change of voltage over a threshold rate is detected; the detector does not know whether or not this is caused by ESD. therefore, the term "ESD detector" refers to an arrangement having detection parameters which would detect an ESD event, rather than to any requirement that an actual ESD event is taking place.

Figure 5:
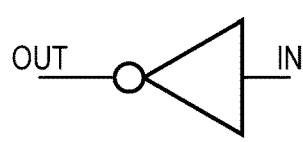
FIG. 5 schematically illustrates an inverter.
Figure 6:
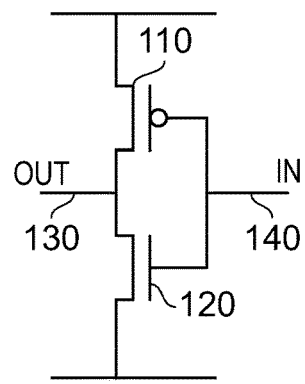
FIG. 6 schematically illustrates an example implementation of an inverter.

The amplifier 50 is implemented, in example arrangements, as a series or succession of amplification stages. The present embodiments make use of one or more such stages, for example two or more such stages. (A single amplifier stage would mean the CDM detector addressing directly the switching element). An example of such an amplification stage is an inverter illustrated in FIG. 5 and shown as an example schematic circuit implementation in FIG. 6 in which a PMOSFET 110 and an NMOSFET 120 cooperate to provide, as an output signal 130, an inverted version of an input signal 140 so that if the input signal goes high, the output goes low, and vice versa.

Figure 7:
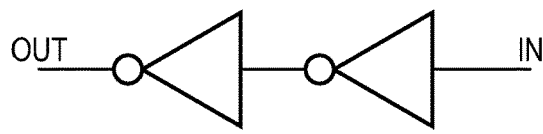
FIG. 7 schematically illustrates a series of successive inverters.

One reason why the chain of amplification stages or inverters is used is that if the detection signal 40 was connected directly to the input of the BigFET 80, the inherent capacitance formed by the BigFET 80 could potentially have a distorting effect on the detection capabilities and time constant of the capacitance 60 of the detector. The parasitic capacitance of BigFET could form a capacitor divider with the detection capacitance. So, a chain of amplification stages or inverters such as a chain shown schematically in FIG. 7 is used partly to isolate the detection capacitance 60 from the capacitance of the BigFET 80.

As mentioned above, power supply clamps may be exposed to ESD events from different causes and having different parameters such as magnitude and temporal characteristics. Two example types of ESD event are the Human Body Model (HBM) type of event, which models a slow rise time, slow decay ESD event, and the Charged Device Model (CDM), which models a fast rise time, fast decay ESD event. Here, in this context, the rise time of the HBM type of event is of the order of a few nanoseconds (ns), for example 2-10 ns, and the decay time (the required sustain or "on" time of the power supply clamp) is of the order of a few hundred ns such as 600 ns (for example, less than 1 µs, but a suitable sustain or "on" time is greater than 600 ns). CDM ESD events can be much faster, for example exhibiting a rise time measurable in picoseconds (ps) (for example, less than 1 ns) and decay times of perhaps a few ns (for example, up to 2 ns). The HBM and CDM detector modules discussed below are configured to work within the parameters set out above.

Therefore, there are various potentially conflicting requirements upon the detector 30 and amplifier 50 in order that the power supply clamp can operate in respect of HBM and CDM ESD events. To react quickly enough to an event showing CDM characteristics, a very rapid detection is required. Here, the rapidity of the detection includes any delays imposed by the amplifier 50, so that the detector 30 and amplifier 50 must cooperate to provide a control signal 20 causing activation of the switching component at a very early stage of the ESD event. However, to provide for the relatively slow decay of an HBM ESD event, the control signal 20 should be held in an active state (that is to say, in a state which causes the switching component 10 to provide the low impedance path) for sufficiently long for an HBM ESD event to subside.

Figure 8:
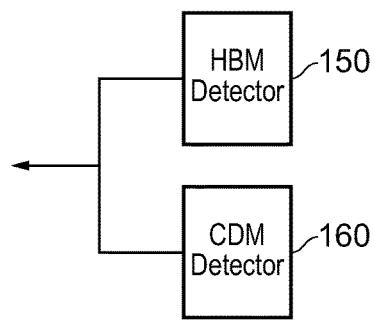
FIG. 8 schematically illustrates an ESD detector.

To address these conflicting requirements, one option is to provide separate detection arrangements for HBM events and CDM events, as illustrated schematically in FIG. 8 by a separately drawn HBM detector 150 and CDM detector 160. However, in a simple arrangement of this nature, there still remains the issue that the delay imposed by the amplifier 50 can be greater than the time period during which a CDM detection must be implemented by switching the switching component 10 on.

Figure 9:
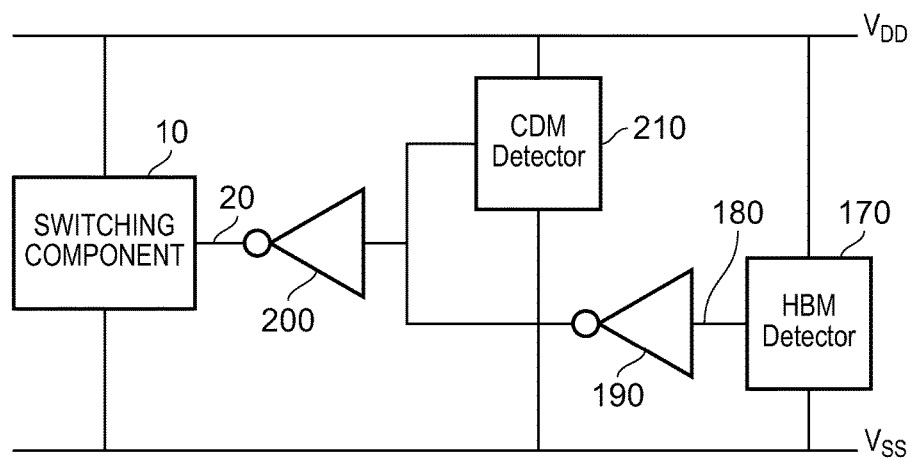
FIG. 9 schematically an example power supply clamp.

To address this, FIG. 9 schematically illustrates a power supply clamp connectable between power rails (for example, $V_{DD}$ and $V_{SS}$) of an electronic circuit, the power supply clamp comprising a switching component 10 which is switchable to provide a connection path (such as a low impedance path, for example a path having an impedance of less than 1Ω) between the power rails, a first detector 170 configured to detect an ESD event having a first characteristic time period (such as an HBM event) and to generate a detector output signal 180 in response to such a detection, a series of one or more successive intermediate amplification stages implemented here as inverters 190, 200 between the first detector 170 and the switching component 10, and arranged so that the series of stages 190, 200 provides a control signal path for a control signal 20 to control switching of the switching component in response to the detector output signal 180. For example, the control signal can be based or generated, at least in part, on the detector output signal 180. A second detector 210 is configured to detect an ESD event having a second characteristic time period shorter than the first characteristic time period (for example, a characteristic time period of a CDM event). The second detector is provided, in this example, at a second or subsequent one of the series of intermediate amplification stages 190, 200 (though it may be provided elsewhere, and more generally it is provided at a node in the control signal path subsequent to the first detector, which is to say, subsequent to a node to which the first detector is connected, coupled or provided) so that a detection by the second detector causes the control signal 20 to control switching of the switching component 10 into the low impedance state. For example, the control signal can be based or generated, at least in part, on the detector output signal from the second detector 210. The arrangement can therefore be considered as one in which the series of one or more intermediate amplification stages generates the control signal from a detection signal provided by either or both of the first and second detectors. For example, a detection by the second detector causes generation of the control signal to control switching of the switching component. For example, a detection by the first detector causes generation of the control signal to control switching of the switching component.

The characteristic time period may refer to one or more of: a rise time of an associated ESD event; a decay time of an associated ESD event; and/or a time constant of an RC circuit forming at least a part of the detector.

In the arrangement of FIG. 9, the HBM detector 170, with its associated large capacitance (required, as discussed above, to allow it to detect slow rise time and slow decay ESD events) is isolated from the BigFET or other switching component 10 by two or more intermediate amplification stages such as inverters (190, 200). In contrast, the CDM detector 210 is required to detect much faster rise time and faster decay ESD events and so may be implemented using a significantly smaller capacitance. This in turn allows it to be placed closer within the circuit structure to the BigFET without its detection incorrectly interacting with the presence of the BigFET. In turn, this means that the delay between the CDM detector 210 and the switching component 10 is lower because fewer stages of the series of intermediate amplification stages are present between the CDM detector 210 and the switching component 10. In the example of FIG. 9, the second (CDM) detector is provided at a node between the first amplification stage 190 and the second amplification stage 200, which is an example of a node subsequent (in the control signal path provided by the amplification stages 190, 200) to that of the first (HBM) detector (the input to the first amplification stage 190).

In the discussion above, it was specified in some examples that the CDM detector (as the "second detector") was provided at a second or subsequent stage of the series of amplification stages. More generally, the second detector is provided at a node in the control signal path subsequent to the first detector. Note that two or more amplification stages may be used so that, for example, a series of two, three, four and so on amplification stages may be provided with corresponding nodes being provided at least at positions between amplification stages. The terminology "provided at a node" can refer to provision at the input, output or another part of an amplification stage. Therefore, the provision of the second detector at a second or subsequent amplification stage could imply (as illustrated schematically in FIG. 9) that the second detector 210 is provided at an input to a second stage (or indeed at an input to a subsequent stage in the case of a series of amplification stages having three or more stages). In example embodiments, the second detector is not provided at the output of a final stage of the series (which is to say, it is not provided directly at the input to the BigFET or other switching component 10). Note however that the second detector could in fact be arranged so that its output goes directly to the BigFET.

Figure 10:
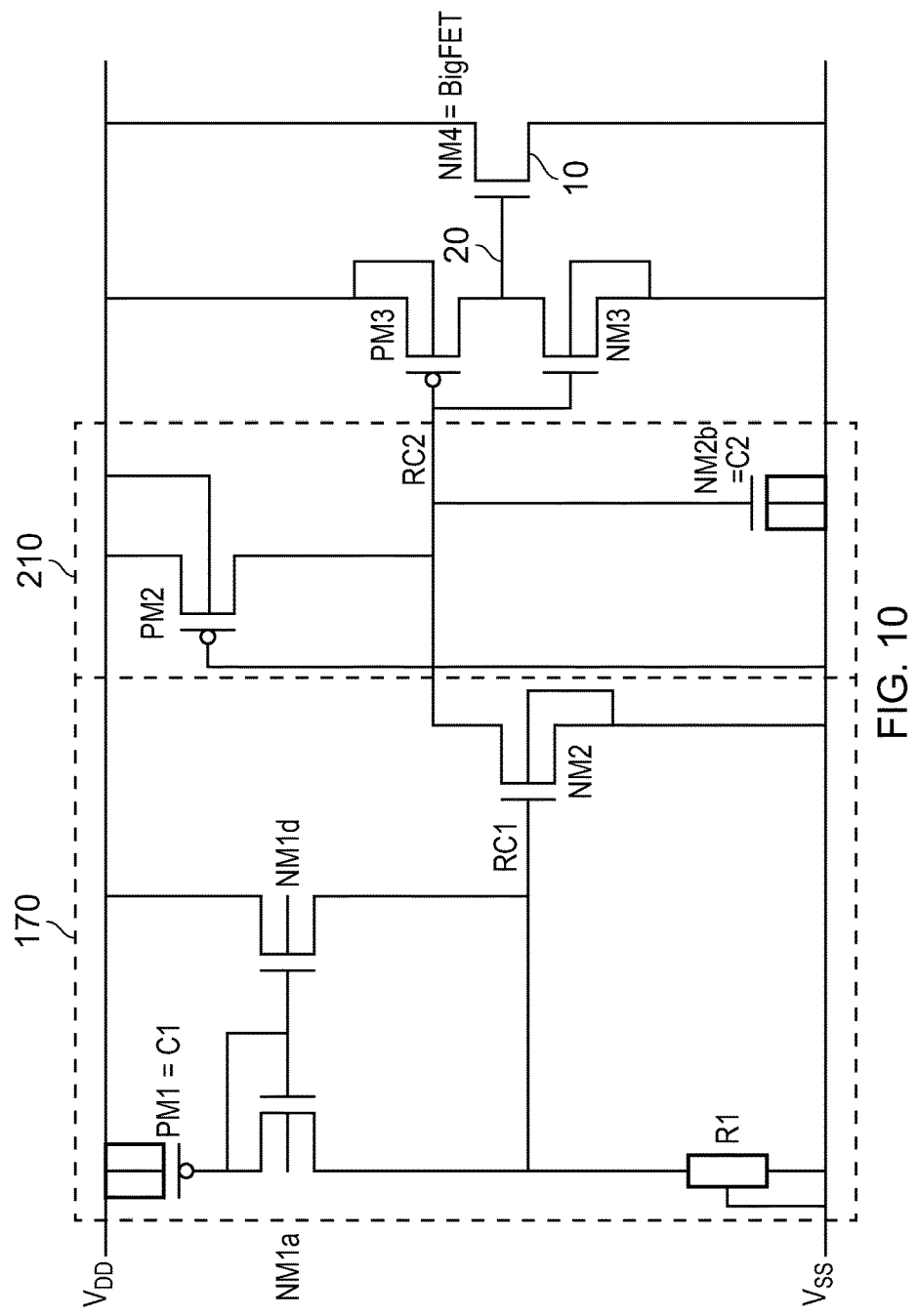
FIG. 10 is a schematic circuit diagram of the power supply clamp of FIG. 9.

FIG. 10 is a schematic circuit diagram of the power supply clamp of FIG. 9. Components bounded by a box 170 represent the HBM detector and components bounded by a box 210 represent the CDM detector.

The switching component 10 (BigFET) is arranged to be off under normal operating conditions (when $V_{DD}$ is powered) and on only during the ESD pulse duration.

Referring to the HBM detector, a transistor PM1 acts as a capacitance (as described with reference to FIG. 3 above) and a resistance R1 (which could for example be implemented as a transistor as discussed above) acts as the resistor of the schematic circuit of FIG. 2. Under the influence of an HBM ESD event, a positive rising voltage difference between $V_{DD}$ and $V_{SS}$ will cause a detection output RC1 to rise. The transistors PM2 and NM2 act (in respect of HBM detection) as a first inverter stage and cause an intermediate signal RC2 to fall. Transistors PM3 and NM3 act as a second inverter stage causing the control signal 20 to rise, switching on the BigFET acting as the switching component 10. In this regard, the second inverter (where the 2nd detection stage is inserted) may be different from a normal complementary CMOS stage in that it comprises a PMOSFET acting as a resistor (hard tied ON) and an NMOSFET gate driven from the previous stage.

Under the influence of a shorter duration CDM ESD event, the characteristic time associated with R1 and C1 is too slow to allow RC1 to react efficiently enough to the CDM ESD stress, but the transistor PM2 (acting in this context as a resistance) and a smaller capacitance C2 act as a second resistance-capacitance stage with a shorter characteristic time. In response to the CDM ESD event the combination of PM2 and C2 pull the signal RC2 low causing the inverter stage formed of PM3 and NM3 to take the control signal 20 high, triggering the BigFET acting as the switching component 10 to an "on" state. The transistors NM1*a* and NM1*d* act as a current mirror to amplify the current flow at the capacitor C1. This can allow a smaller capacitor to be use (which in the context of an integrated circuit device can mean a smaller chip area being required to implement the capacitance) while achieving the same time constant.

In embodiments, the sustain time (for which the CDM detector remains on) can be arranged to be the same as, or substantially the same as, the delay time associated with activation of the HBM detector (for example, 2 ns, or in a range of 2 ns to 10 ns, for example no more than 10 ns).

Figure 11:
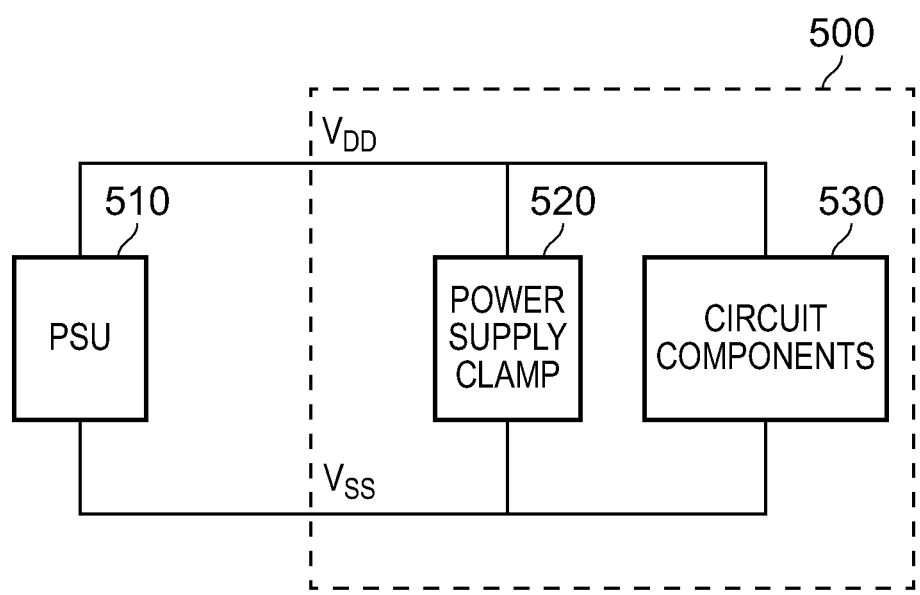
FIG. 11 schematically illustrates an electronic circuit and a power supply.

FIG. 11 schematically illustrates an electronic circuit 500 and a power supply 510. The electronic circuit 500 comprises a power supply clamp 520 of the type discussed above and circuit components 530 to be protected against ESD events relating to the functionality of the electronic circuit 500. The power supply clamp 510 is connected across the power rails $V_{DD}$ and $V_{SS}$ of the electronic circuit and operates so as to provide a low impedance path between the power rails $V_{DD}$ and $V_{SS}$ if an ESD event is detected, and therefore to provide a degree of protection against ESD damage to the circuit components 530. The power supply 510 may be constrained to have no greater than a minimum threshold switch-on (rise) time such as 10 µs, in order to avoid the accidental triggering of the ESD protection via the power supply clamp at power-up.

Note also that a normal power-up could be detected as an ESD event, except that the time scale is generally different (slower). Therefore it can be useful to have the clamp differentiating an voltage rise due to ESD from one due to power-up. And in case it would be false triggered by a power-up, it is important as mentioned that it switch-off quickly to return to normal operation. These features are provided by at least some embodiments of the present disclosure, and may be assisted for example by limiting the switch-on time as discussed above.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. A power supply clamp connectable between power rails of an electronic circuit, the power supply clamp comprising:
   a switching component which is switchable to provide a connection path between the power rails of the electronic circuit;
   a first detector configured to detect an electrostatic discharge event having a first characteristic time period and to generate a detector output signal in response to the detection;
   a series of one or more successive intermediate amplification stages between the first detector and the switching component, the series of amplification stages providing a control signal path for a control signal to control switching of the switching component in response to the detector output signal; and
   a second detector configured to detect an electrostatic discharge event having a second characteristic time period, shorter than the first characteristic time period, the second detector being provided at a node in the control signal path subsequent to the first detector so that a detection by the second detector causes the control signal to control switching of the switching component;
   wherein the first and second detectors independently turn on the switching component based on the respective first and second characteristic time period through the control signal to cause a flow of current between the power rails of the electronic circuit.

2. The power supply clamp of claim 1, in which the first detector is a human body model electrostatic discharge event detector.

3. The power supply clamp of claim 1, in which the first detector is configured to detect an electrostatic discharge event having a voltage rise time of between 2 and 10 nanoseconds.

4. The power supply clamp of claim 1, in which, in response to detection of an electrostatic discharge event, the first detector is configured to maintain the detector output signal for at least 600 nanoseconds.

5. The power supply clamp of claim 1, in which the first detector comprises a capacitance and a resistance connected in series between the power rails of the electronic circuit.

6. The power supply clamp of claim 5, comprising a current mirror connected to the capacitance of the first detector.

7. The power supply clamp of claim 1, in which the second detector is a charged device model electrostatic discharge event detector.

8. The power supply clamp of claim 1, in which the second detector is configured to detect an electrostatic discharge event having a voltage rise time of less than 1 nanosecond.

9. The power supply clamp of claim 1, in which, in response to detection of an electrostatic discharge event, the second detector is configured to maintain the detector output signal for no more than 10 nanoseconds.

10. The power supply clamp of claim 1, in which the series of successive intermediate amplification stages comprises a series of successive inverter circuits each comprising a transistor pair, series-connected between the power rails.

11. The power supply clamp of claim 1, in which the second detector comprises a capacitance and a resistance connected in series between the power rails and with an output signal going to a node in the control signal path.

12. The power supply clamp of claim 1, in which the switching component comprises a transistor switchable to provide a connection path having an impedance of less than 1 ohm between the power rails.

13. The power supply clamp of claim 1, in which: the series of one or more successive intermediate amplification stages comprises a series of two or more successive amplification stages; and the second detector is provided at a second or subsequent one of the series of intermediate amplification stages.

14. An electronic circuit comprising the power supply clamp of claim 1.

15. A power supply clamp connectable between power rails of an electronic circuit, the power supply clamp comprising:
   switching means which is switchable to provide a connection path between the power and ground rails of the electronic circuit;

first detecting means for detecting an electrostatic discharge event having a first characteristic time period and generating a detector output signal in response to the detection;

a series of one or more successive intermediate amplifying means between the first detecting means and the switching means, the series providing a control signal path for a control signal to control switching of the switching means in response to the detector output signal; and second detecting means for detecting an electrostatic discharge event having a second characteristic time period, shorter than the first characteristic time period, the second detecting means being provided at a node in the control signal path subsequent to the first detecting means so that a detection by the second detecting means causes the control signal to control switching of the switching means;

wherein the first and second detecting means independently turn on the switching means based on the respective first and second characteristic time period through the control signal to cause a flow of current between the power rails of the electronic circuit.

* * * * *